United States Patent
Yasukawa et al.

(10) Patent No.: US 7,019,456 B2
(45) Date of Patent: Mar. 28, 2006

(54) ORGANIC EL DISPLAY DEVICE

(75) Inventors: Akiko Yasukawa, Kokubunji (JP); Masato Ito, Mobara (JP)

(73) Assignee: Hitachi Displays, Ltd., Mobara (JP)

( * ) Notice: Subject to any disclaimer, the term of this patent is extended or adjusted under 35 U.S.C. 154(b) by 72 days.

(21) Appl. No.: 10/733,317

(22) Filed: Dec. 12, 2003

(65) Prior Publication Data

US 2004/0178723 A1    Sep. 16, 2004

(30) Foreign Application Priority Data

Dec. 12, 2002   (JP) .............................. 2002-360074

(51) Int. Cl.
*H05B 33/00* (2006.01)

(52) U.S. Cl. ...................... 313/504; 313/506; 313/512; 313/112

(58) Field of Classification Search ................ 313/112, 313/504, 506, 512, 511; 315/169.3; 345/36, 345/45

See application file for complete search history.

(56) References Cited

U.S. PATENT DOCUMENTS

| 5,596,246 | A | * | 1/1997 | Budzilek et al. ............ 313/502 |
| 5,932,362 | A | * | 8/1999 | Nagai et al. ................ 428/690 |
| 6,340,824 | B1 | * | 1/2002 | Komoto et al. ............... 257/99 |
| 6,872,766 | B1 | * | 3/2005 | Schunk et al. .............. 524/357 |

FOREIGN PATENT DOCUMENTS

JP         2000-223271      *   8/2000

* cited by examiner

*Primary Examiner*—Ashok Patel
(74) *Attorney, Agent, or Firm*—Antonelli, Terry, Stout and Kraus, LLP.

(57) ABSTRACT

In an organic EL (electroluminescent) display device, which has a substrate having a first principal surface and a second principal surface opposed to the first principal surface and a light emitting material layer formed at the first principal surface of the substrate, a light absorption layer is provided for absorbing light in a wavelength band lying between 350 nm and 410 nm. This light absorption layer is provided at the second principal surface of the substrate opposite to the light emitting material layer and operates to shield the light emitting material layer from the light of the aforementioned wavelength band, which is selectively absorbed by the light emitting material layer. In this way, deterioration of the light emitting material layer can be avoided, so that the organic EL display device can maintain a sufficient display brightness even after being irradiated with excessive external light.

3 Claims, 3 Drawing Sheets

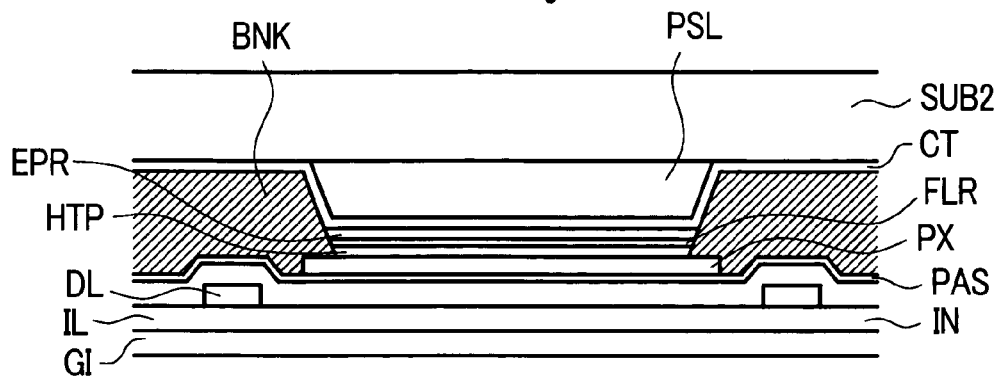
FIG. 5
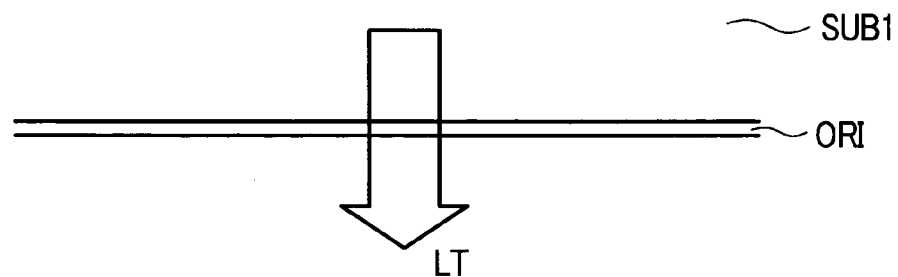
FIG. 6
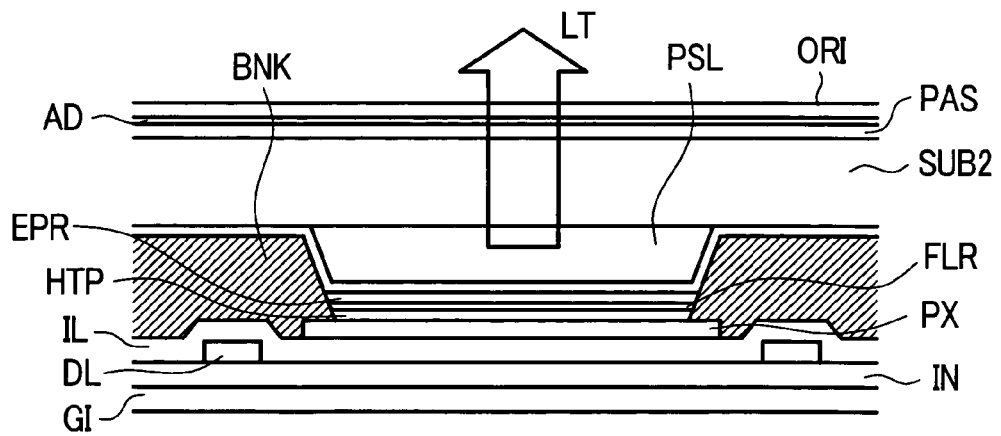

ORGANIC EL DISPLAY DEVICE

BACKGROUND OF THE INVENTION

The present invention relates to an organic EL (Electroluminescent) display device in which a technique is employed for preventing deterioration of the light emitting material thereof by ambient light.

In an active-matrix-type organic EL display device, respective gate signal lines, which extend in the x direction and are arranged in parallel in the y direction, and respective drain signal lines, which extend in the y direction and are arranged in parallel in the x direction, are formed on one surface of a substrate, and regions surrounded by the gate signal lines and the drain signal lines constitute pixel regions. Each pixel region is provided with a switching element, which is turned on in response to a scanning signal from the gate signal line, and a pixel electrode to which a video signal is supplied from the drain signal line through the switching element.

The pixel electrode is configured such that a light emitting material layer is interposed between the pixel electrode and a counter electrode, and the light emitting material layer emits light in response to an electric current which flows between the pixel electrode and the counter electrode. Here, the counter electrode is, for example, formed over respective pixel regions in common, and a signal having a voltage which becomes a reference with respect to the video signal is applied to the counter electrode. Then, by forming at least either one of the pixel electrode and the counter electrode as a light-transmitting conductive layer, light from the light emitting material layer can be allowed to pass out to this one electrode side, from which the light reaches the eyes of an observer.

The following publications by the inventors of the present patent application disclose examples of this type of EL display device.
Patent Document 1: Japanese Unexamined Patent Publication 1996-321381.
Patent Document 2: Japanese Unexamined Patent Publication 2000-223271.

SUMMARY OF THE INVENTION

However, with respect to an organic EL display device having such a constitution, it has been pointed out that the light emitting material layer is liable to be easily degraded by ambient light from the sun or a fluorescent lamp. This is because polyphenylene vinylene (PPV) or the like, for example, contained in the light emitting material layer generates a photooxidation due to radiation of the ambient light and is decomposed. Accordingly, there has been a drawback in that the lifetime and the stability of the organic EL display device cannot be sufficiently ensured.

The present invention has been made in view of such circumstances, and it is an object of the present invention to provide an organic EL display device in which degradation of the light emitting material layer thereof can be obviated.

A summary of representative examples of the invention disclosed in this specification, will be presented as follows.

EXAMPLE 1

In an organic EL display device according to the present invention in which, for example, a light emitting material layer is formed on one surface side of a substrate and light from the light emitting material layer is taken out to the substrate side, the improvement is characterized in that a material layer capable of absorbing light having a wavelength of not less than 350 nm and not greater than 410 nm is formed on another surface side of the substrate.

EXAMPLE 2

In an organic EL display device according to the present invention in which, for example, a light emitting material layer is formed on one surface side of a substrate and light from the light emitting material layer is taken out to the substrate side, the improvement is characterized in that a material layer capable of absorbing light having a wavelength of not less than 350 nm and not greater than 410 nm is formed between the light emitting material layer and the substrate.

EXAMPLE 3

The organic EL display device according to the present invention is, for example, formed based on the constitution of Example 1, and is characterized in that a circularly polarizing plate is formed such that the circularly polarizing plate is stacked on another surface side of the substrate together with the material layer.

EXAMPLE 4

The organic EL display device according to the present invention is, for example, formed based on the constitution of Example 3, and is characterized in that the circularly polarizing plate is fixed to the material layer by way of an adhesive agent and an ultra-violet-ray absorbing material is mixed into the adhesive agent.

EXAMPLE 5

The organic EL display device according to the present invention is, for example, formed based on the constitution of Example 3, and is characterized in that the material layer also functions as an adhesive agent which fixes the circularly polarizing plate to the substrate.

EXAMPLE 6

In an organic EL display device according to the present invention in which, for example, a light emitting material layer is formed on one surface side of a substrate and light from the light emitting material layer is taken out to the substrate side, the improvement is characterized in that a touch panel is arranged on another surface side of the substrate and the touch panel is fixed to the substrate using an adhesive agent which absorbs light having a wavelength of not less than 350 nm and not greater than 410 nm.

One example of the organic EL display device according to the present invention can also be described more specifically as follows.

In an organic EL display device which comprises a substrate having a first principal surface and a second principal surface opposed to the first principal surface and a light emitting material layer (formed of an organic electroluminescent material) formed at the first principal surface of the substrate, a material layer (a light absorption layer) capable of absorbing light which lies a wavelength band lying between 350 nm and 410 nm is formed at the second principal surface of the substrate so as to be disposed opposite to the light emitting material layer. If a plurality of the light emitting material layers are arranged two-dimensionally on the first principal surface of the substrate, the light absorption layer may be extended on the second principal surface so as to be opposite to the plurality of the light emitting material layers. If at least one organic material layer is provided on at least one of an upper side and a lower side of the light emitting material layer formed above the first principal surface of the substrate, the light absorption layer should be formed to be opposite to the at least one organic material layer. Consequently, the light absorption layer shields the light emitting material layer (and the at least one organic material layer) from a component of external light incident on the second principal surface from the outside of the organic EL display device having a wavelength not less than 350 nm and not greater than 410 nm.

Here, the present invention is not limited to the above-mentioned constitutions, and various modifications are conceivable without departing from the technical concept of the present invention.

BRIEF DESCRIPTION OF THE DRAWINGS

FIG. 5 is a cross-sectional view showing another embodiment of the pixel of the organic EL display device according to the present invention; and FIG. 6 is a cross-sectional view showing another embodiment of the pixel of the organic EL display device according to the present invention.

DETAILED DESCRIPTION

Second embodiments of an organic EL display device according to the present invention will be explained in conjunction with the attached drawings.

EMBODIMENT 1

<<Constitution of a pixel>>

Figure 1:
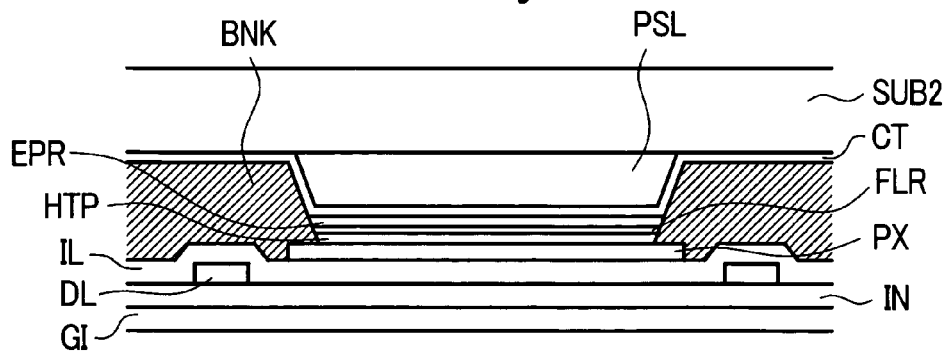
FIG. 1 is a cross-sectional view taken along line I—I in FIG. 2, showing one embodiment of a pixel of an organic EL display device according to the present invention.
Figure 2:
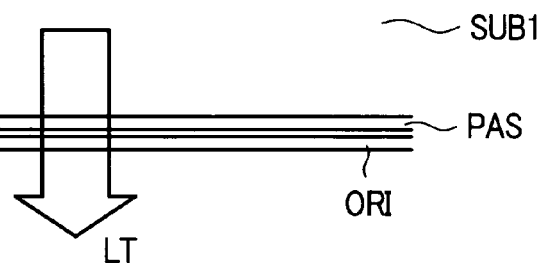
FIG. 2 is a diagrammatic plan view showing one embodiment of the pixel of the organic EL display device according to the present invention.
Figure 2:
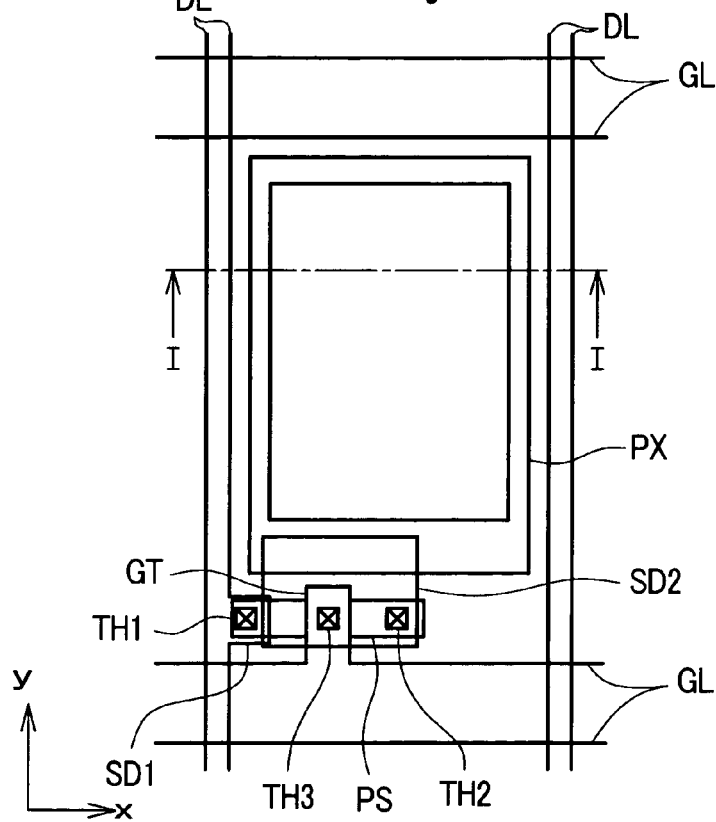

FIG. 2 is a plan view showing one embodiment of a pixel of an organic EL display device. Further, a cross section taken along a line I—I in FIG. 2 is shown in FIG. 1.

Here, the pixel shown in FIG. 2 represents a typical one of the respective pixels which are arranged in a matrix array, and, hence, respective pixels which are arranged at left and right sides and above and below the illustrated pixel have a similar constitution.

In FIG. 2, for example, on a left-lower portion of the pixel region on the surface of a substrate SUB1 made of glass, for example, (see FIG. 1), a semiconductor layer PS is formed of a polysilicon layer extending in the x direction, as seen in the drawing. This semiconductor layer PS constitutes a semiconductor layer of a thin film transistor TFT. Further, an insulation film GI (see FIG. 1) is formed on the surface of the substrate SUB1 such that the insulation film GI also covers the semiconductor layer PS. The insulation film GI functions as a gate insulation film on a region where the thin film transistor TFT is formed.

On a surface of the insulation film GI, gate signal lines GL extend in the x direction and are arranged in parallel in the y direction. The gate signal lines GL are formed such that they define the above-mentioned pixel region together with drain signal lines DL to be described later. Further, the gate signal line GL is formed in common with respect to respective pixel regions arranged in parallel in the x direction, as seen in the drawing. The gate signal line GL has a portion thereof which forms an extending portion, which extending portion traverses an approximately center portion of the semiconductor layer PS, and this extending portion functions as a gate electrode GT of the thin film transistor TFT.

After formation of the gate electrode GT, impurity ions are implanted to the semiconductor layer PS, using the gate electrode GT as a mask, so that portions of the semiconductor layer PS at regions other than a region arranged immediately below the gate electrode GT exhibit a low resistance.

An insulation film IN (see FIG. 1) is formed on the surface of the substrate SUB1 such that the insulation film IN also covers the gate signal lines GL (gate electrodes GT). The insulation film IN functions as an interlayer insulation film with respect to the gate signal lines GL in regions where the drain signal lines DL to be described hereinafter are formed. The drain signal lines DL, which extend in the y direction and are arranged in parallel in the x direction, are formed on a surface of the insulation film IN. A portion of the drain signal line DL extends to an end portion of the semiconductor layer PS and is connected with the semiconductor layer PS via a through hole TH1, which is preliminarily formed so as to penetrate the insulation film IN and the insulation film GI. That is, the extending portion of the drain signal line DL functions as a drain electrode SD1 of the thin film transistor TFT. Further, the drain signal line DL is formed in common with respect to respective pixel regions which are arranged in parallel in the y direction, as seen in the drawing.

A source electrode SD2 is formed on another end portion of the semiconductor layer PS so as to be connected to the semiconductor layer PS via a through hole TH2, which is formed to pierce both the insulation film IN and the insulation film GI beforehand, and the source electrode SD2 has an extension portion thereof formed to be connected with the pixel electrode PX, to be described later.

On the surface of the substrate SUB1 on which the drain signal lines DL (drain electrodes SD1) and the source electrodes SD2 are formed, an insulation film IL (see FIG. 1) is formed. On an upper surface of the insulation film IL, the pixel (anode) electrode PX is formed at the center, except for a trivial periphery of each pixel region, while the pixel electrode PX is connected to the source electrode SD2 of the thin film transistor TFT via a through hole TH3 that is formed in the insulation film IL. Here, the pixel electrode PX is formed of a light transmitting conductive film made of ITO (Indium Tin Oxide) or the like, for example. This provision is made for allowing light from the light emitting material layer FLR to be described later to pass to the substrate SUB1 side.

On an upper surface of the pixel electrode PX, the light emitting material layer FLR is formed on a hole transporting layer HTP, and an electron injection layer EPR is further stacked on the light emitting material layer FLR. These respective layers, including the light emitting material layer FLR and the light emitting material layer and the like of another pixel region, are formed such that they are defined by bank (partition wall) films BNK that are formed of an organic material layer.

On upper surfaces of the electron injection layer EPR and the bank film BNK, a counter (cathode) electrode CT is formed in common with respect to respective pixel regions. A substrate SUB2 made of glass, for example, is laminated to an upper surface of the counter electrode CT by way of a high molecular resin seal PSL.

By allowing an electric current to flow in the light emitting material layer FLR that is interposed between the pixel electrode PX and the counter electrode CT, the light emitting material layer FLR emits light, and this light LT can be observed with the eyes through the pixel electrode PX and the substrate SUB1. Here, a voltage signal, which becomes a reference with respect to the video signal, is applied to the counter electrode CT, while a video signal is applied to the pixel electrode PX from the drain signal line DL through the thin film transistor TFT. Further, the thin film transistor TFT is turned on in response to a scanning signal from the gate signal line GL.

Further, in this embodiment, on a surface of the substrate SUB1, which is opposite to the surface of the substrate SUB1 on which the light emitting material layer FLR is formed, that is, on an observation-side surface, first of all, a protective film PAS is formed. The protective film PAS is formed of a material which absorbs light having a short wavelength of not less than 350 nm and not greater than 410 nm, and, hence, of the ambient light directed toward the substrate SUB1, light having the above-mentioned wavelength is not irradiated to the light emitting material layer FLR. As the protective film PAS, for example, UV GUARD (made by Fuji Photo Film Company Ltd., Tokyo, Japan) or an ultra violet ray cut filter/clear-type (made by Ruru Inc., Osaka, Japan) can be selected. The protective film PAS is provided for preventing the decomposition generated by photooxidation of the light emitting material layer FLR due to the irradiation of light having the above-mentioned wavelength, thus sufficiently ensuring the lifetime and the stability of the light emitting material layer FLR.

Further, a circularly polarizing plate ORI is fixed to the protective film PAS by way of an adhesive agent AD. The circularly polarizing plate ORI is provided for overcoming any difficulty in observing the display screen caused by the reflection of ambient light on the counter electrode CT. In this case, since the circularly polarizing plate ORI also has a function of blocking light having a short wavelength, along with the function of the protective film PAS, the circularly polarizing plate ORI also has the advantageous effect of enhancing the reliability with respect to the life and the stability of the light emitting material layer FLR.

Further, it is possible to obtain a further reliable advantageous effect by using an adhesive agent containing an ultra-violet-ray absorbing material as the adhesive agent AD, which is required for fixing the circularly polarizing plate ORI to the protective film PAS. Here, as the ultra violet ray absorbing material, for example, 2-(3-Cyano-3-methyl-sulfonyl-2-propenylidene)-3-(3-sulfobutyl)-thiazoline sodium salt, which is obtained as a product number: ADA3193 of H.W. SANDS CORP. (FL., USA) or the like, can be used. This ultra-violet-ray absorbing material, as described at the Home Page: http://www.hwsands.com/snapshotpgs/ada3193snap.htm of the H.W. SANDS CORP., favorably absorbs light in a wavelength band lying from 350 nm as a longer wavelength side of an ultraviolet region to 410 nm as a shorter wavelength side of a visible region (violet) with respect to 382 nm as a center of the wavelength band where the maximum optical absorption value thereof appears. By mixing a proper amount of such an ultra-violet-ray absorbing material into an acrylic tacky adhesive agent, the above-mentioned adhesive agent can be obtained.

In place of the above-mentioned ultra-violet-ray absorbing material, a benzotriazole series organic compound or a benzophenone series organic compound may be used. Further, the above-mentioned adhesive agent may be prepared by dispersing particulates of inorganic material, such as zinc oxide, cerium oxide, zirconium oxide, iron oxide, and titanium oxide, as a filler into a binder, such as resin material which constitutes the tacky adhesive agent. Particularly, when zinc oxide is used as the filler of an adhesive layer, for producing an increase of the dispersion amount of the filler into the binder, it is possible to maintain the adhesive layer in a transparent state with respect to visible light having a wavelength of not less than 410 nm.

<<Manufacturing method>>

In the above-mentioned constitution, as the substrate SUB1, a substrate having a thickness of 1.1 mm, for example, is used. Further, as the pixel electrode PX, for example, an ITO (Indium Tin Oxide) film having a a thickness of 150 nm, for example, is formed over an area of 150 μm×170 μm by a selective etching method based on a photolithography technique.

An acrylic high molecular resin film having a film thickness of 1 μm, for example, is applied as the bank film BNK and is formed by a selective etching method based on a photolithography technique. After the formation of the bank film BNK, the substrate SUB1 having the bank film BNK is cleaned and is subjected to a UV ozone irradiation treatment so that any remaining organic component on the surface of the pixel electrode PX exposed from the bank film BNK is removed or cut off.

Next, using a vacuum evaporation shadow mask, the hole-transporting layer HTP is selectively formed on an upper surface of the pixel electrode PX surrounded by the bank film BNK. This hole-transporting layer HTP having a film thickness of 50 nm, for example, is formed of N,N'-di (1-naphthyl)-N,N'-diphenyl-{1,1'-biphenyl}-4,4'-diamine, αNPD, under $10^{-6}$ torr at a vacuum evaporation rate of 0.2 nm/sec. Using the same vacuum evaporation shadow mask, the light emitting material layer FLR, is formed on an upper surface of the hole-transporting layer HTP. This light emitting material layer FLR having a film thickness of 40 nm, for example, is formed of tris(8-quinolinolato)aluminum complex, Alq, for example, under the same conditions as provided at the time of forming the mentioned hole-transporting layer HTP.

Under the same conditions, the electron injection layer EPR is formed of LiF, having a film thickness of 0.5 nm, for example. Thereafter, an aluminum layer having a thickness of 100 nm, for example, is formed by vacuum evaporation at a vacuum evaporation rate of 1 nm/sec, for example, thus forming the counter electrode CT, which is made of an aluminum layer.

Then, the substrate SUB1, that is formed in this manner is transferred to a sealing glove box, wherein the substrate SUB2, which is made of glass, for example, is laminated to a surface of the substrate SUB1 on which the counter electrode CT is formed using a high molecular resin seal PSL of an ultraviolet curing type, and, thereafter, the high molecular resin seal PSL is cured for sealing by the irradiation of ultraviolet rays.

Then, on a surface of the substrate SUB1 opposite to the surface on which the light emitting material layer FLR is formed, the protective film PAS is formed. The protective film PAS is made of a material which absorbs short wavelength light up to 410 nm. Next, the circularly polarizing plate ORI is laminated to a surface of the protective film PAS by way of the adhesive agent AD.

<<Advantageous effect>>

In the organic EL display device having such a constitution, when a DC voltage is applied between the pixel electrode PX and the counter electrode CT and the luminance-voltage characteristics of a green light emission from the light emitting material layer is measured, a luminance of approximately 1000 cd/m$^2$ is obtained at a voltage of 8V. Thereafter, when a xenon lamp light is irradiated for 5 hours at an illumination of 6 mW/cm$^2$ (wavelength: 405 nm) and the luminance-voltage characteristics of the light emission is measured, a luminance of approximately 930 cd/m$^2$ is obtained at a voltage of 8V.

Here, with respect to an organic EL display device having no such protective film PAS, when the xenon lamp light is irradiated for 5 hours at an illumination of 6 mW/cm$^2$ (wavelength: 405 nm) and the luminance-voltage characteristics of the light emission is measured, a luminance of approximately 600 cd/m$^2$ is obtained at a voltage of 8V.

According to the present invention, in an organic EL display device in which a light emitting material layer FLR is formed on one surface (first main surface) of the substrate SUB1, a material layer (the protective film PAS, the adhesive layer AD) which absorbs light having a wavelength band of not less than 350 nm and not greater than 410 nm is formed on another main surface of the substrate SUB1 (the second main surface which faces the first main surface in an opposed manner) such that the material layer faces the light emitting material layer FLR in an opposed manner. This material layer absorbs not only ultraviolet rays, but also light on the small-wavelength side of the visible region. Accordingly, when the light emitted from the light emitting material layer FLR is irradiated from another main surface (the second main surface) of the substrate SUB1 to the outside of the display device (the display panel), visible light having a short-wavelength (the violet light) is also absorbed. However, when either one of monochromic image or a color image is displayed using the organic EL display device, since the luminance and the tone are adjusted at the side having a wavelength longer than 410 nm, there is no possibility that the material layer degrades the quality of the display image. Rather, the material layer can absorb light in the wavelength band containing a portion of the visible region, which may be selectively absorbed in the light emitting material layer and the organic material layer arranged close to the light emitting material layer, and can accelerate the decomposition of such layers, whereby the organic EL display device according to the present invention can maintain a sufficient light emitting luminance even after an excessive ambient light is irradiated thereon.

EMBODIMENT 2

In the embodiment 1, in laminating the substrate SUB2 to the substrate SUB1 using the high molecular resin seal PSL, a constitution in which the high molecular resin seal PSL is filled in the inside of the region surrounded by the bank film BNK is adopted. However, it is needless to say that the region may be formed in a hollow state.

Further, as the adhesive agent AD which causes the circularly polarizing plate ORT to adhere to the protective film PAS, for example, a material which is constituted as a mixture of 20% of the above-mentioned 2-(3-Cyano-3-methylsulfonyl-2-propenylidene)-3-(3-sulfobutyl)-thiazoline sodium salt, which is obtained as a product number: ADA3193 of H.W. SANDS CORP., into the acrylic tacky adhesive agent may be used.

In an organic EL display device having such a constitution, when a DC voltage is applied between the pixel electrode PX and the counter electrode CT and the luminance-voltage characteristics of a green light emission from the light emitting material layer is measured, a luminance of approximately 1000 cd/m$^2$ is obtained at a voltage of 8V. Thereafter, when a xenon lamp light is irradiated for 5 hours at an illumination of 6 mW/cm$^2$ (wavelength: 405 nm) and the luminance-voltage characteristics of the light emission is measured, a luminance of approximately 910 cd/m$^2$ is obtained at a voltage of 8V.

EMBODIMENT 3

In the embodiment 1, in sequentially forming the hole-transporting layer HTP and the light emitting material layer FLR, for example, vacuum evaporation shadow mask is used. However, it is needless to say that the hole-transporting layer HTP and the light emitting material layer FLR may be sequentially formed using an ink jet method. That is, 50 pl of a PEDOT/PSS aqueous solution (poly(ethylenedioxy) thiophene/poly(styrene sulfonic acid) aqueous solution, made by Bayer AG. Leverkusen, Germany) is ejected from a nozzle to form the hole injection layer HTP having a thickness of approximately 50 nm by the ink jet method, and, thereafter, a polyfuluorene-based high molecular light emitting material (made by Dow Chemical Inc.) is ejected to form the light emitting material layer FLR having a thickness of 40 nm by an ink jet method.

In the organic EL display device having such a constitution, when a DC voltage is applied between the pixel electrode PX and the counter electrode CT, a DC voltage is applied and the luminance-voltage characteristics of a green light emission from the light emitting material layer is measured, a luminance of approximately 1000 cd/m$^2$ is obtained at a voltage of 5.5V. Thereafter, when a xenon lamp light is irradiated for 5 hours at an illumination of 6 mW/cm$^2$ (wavelength: 405 nm) and the luminance-voltage characteristics of the light emission is measured, a luminance of approximately 910 cd/m$^2$ is obtained at a voltage of 5.5V.

Here, with respect to the constitution of an organic EL display device having no such protective film PAS, when the xenon lamp light is irradiated for 5 hours at an illumination of 6 mW/cm$^2$ (wavelength: 405 nm) and the luminance-voltage characteristics of the light emission is measured, a luminance of approximately 490 cd/m$^2$ is obtained at a voltage of 5.5V.

EMBODIMENT 4

Figure 3:
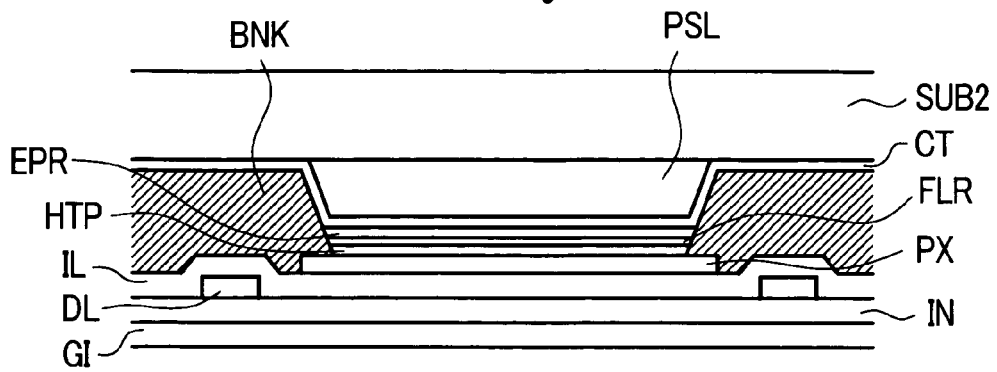
FIG. 3 is a cross-sectional view showing another embodiment of the pixel of the organic EL display device according to the present invention.
Figure 3:
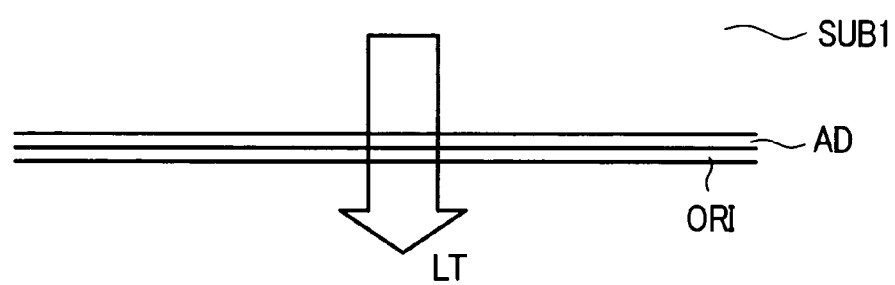

FIG. 3 is a cross-sectional view showing another embodiment of the organic EL display device according to the present invention, and it generally corresponds to FIG. 1.

The organic EL display device shown in FIG. 1 is formed such that the protective film PAS is particularly formed on the surface of the substrate SUB1. It is needless to say that the adhesive agent AD which is used for causing the circularly polarizing plate to adhere to the surface of the substrate SUB1 may be also used for performing the function of the protective film PAS. That is, a material which absorbs light having a wavelength of not greater than 410 nm may be mixed into the adhesive agent, or the material may be used as the material of the adhesive agent per se.

EMBODIMENT 5

Figure 4:
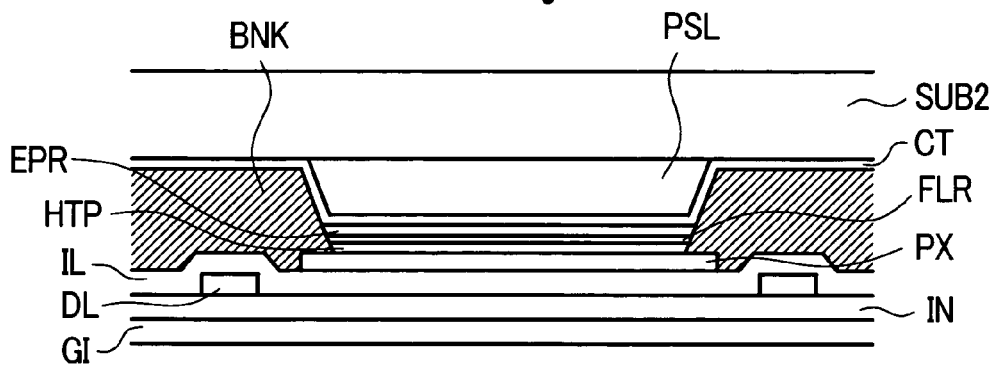
FIG. 4 is a cross-sectional view showing another embodiment of the pixel of the organic EL display device according to the present invention.
Figure 4:
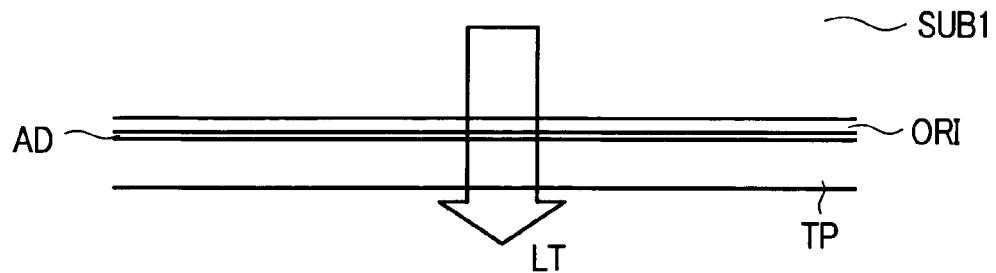

FIG. 4 is a cross-sectional view showing another embodiment of the organic EL display device according to the present invention, and it generally corresponds to FIG. 1.

The feature which makes this embodiment different from the embodiment shown in FIG. 1 lies in the fact that a so-called touch panel TP is arranged on the surface of the substrate SUB1 of the organic EL display device, wherein the touch panel TP is laminated to the circularly polarizing plate ORI, which is formed on the surface of the substrate SUB1 by way of an adhesive agent AD.

Here, it is needless to say that a material which absorbs light having a wavelength of not less than 350 nm and not greater than 410 nm may be mixed into the adhesive agent AD, or the material may be used as the material of the adhesive agent AD per se.

EMBODIMENT 6

FIG. 5 is a cross-sectional view showing another embodiment of the organic EL display device according to the present invention, and it generally corresponds to FIG. 1.

The feature which makes this embodiment different from the embodiment shown in FIG. 1 lies in the fact that the protective film PAS, which is formed on the observation side surface of the substrate SUB1, is formed on the surface of the substrate SUB1 at the light emitting material layer FLR side.

For example, the protective film PAS is formed as a background layer of the pixel electrode PX. However, the protective film PAS is not limited to such a constitution. That is, the protective film PAS may be formed such that at least one of several insulation films IN, IL and the like, which are formed between the light emitting material layer FLR and the surface of the substrate SUB1, is provided with a function similar to the function of the protective film PAS.

EMBODIMENT 7

FIG. 6 is a cross-sectional view showing another embodiment of the organic EL display device according to the present invention, and it generally corresponds to FIG. 1.

The feature which makes this embodiment different from the embodiment shown in FIG. 1 lies, first of all, in the fact that the observation-side surface is formed at the substrate SUB2 side. Accordingly, at least the counter electrode CT is formed of a light transmitting conductive layer. In this case, the pixel electrode PX may be formed of a non-light-transmitting conductive film. Further, the substrate SUB2 is indispensably formed of a light transmitting material, such as glass.

In this case, the protective film PAS is formed on the observation side surface of the substrate SUB2. In this embodiment, the protective film PAS, the adhesive agent AD and the circularly polarizing plate ORI are formed by sequentially stacking them an order from the observation-side surface of the substrate SUB2.

In such a constitution, it is needless to say that the features described in conjunction with the above-mentioned respective embodiments (the constitution which forms the protective film PAS at the substrate SUB1 side) are directly applied to the observation-side surface of the substrate SUB2.

The above-mentioned respective embodiments may be used in a single form or in combination. This is because the advantageous effects of the respective embodiments can be achieved in a single form or synergistically.

As can be clearly understood from the foregoing explanation, according to the features of the organic EL display device of the present invention, degradation of the light emitting material layer can be obviated.

What is claimed is:

1. An organic EL display device in which a light emitting material layer is formed on one surface side of a substrate and light from the light emitting material layer is taken out to the substrate side;
    wherein a material layer which absorbs light having a wavelength not less than 350 nm and not greater than 410 nm is formed on another surface side of the substrate;
    wherein a circularly polarizing plate is formed on the another surface side of the substrate together with the material layer by stacking; and
    wherein the circularly polarizing plate is fixed to the material layer by way of an adhesive agent and an ultra-violet-ray absorbing material is mixed into the adhesive agent.

2. An organic EL display device in which a light emitting material layer is formed on one surface side of a substrate and light from the light emitting material layer is taken out to the substrate side;
    wherein a material layer which absorbs light having a wavelength not less than 350 nm and not greater than 410 nm is formed on another surface side of the substrate;
    wherein a circularly polarizing plate is formed on the another surface side of the substrate together with the material layer by stacking; and
    wherein the material layer also functions as an adhesive agent which fixes the circularly polarizing plate to the substrate.

3. An organic EL display device in which a light emitting material layer is formed on one surface side of a substrate and light from the light emitting material layer is taken out to the substrate side,
    wherein a touch panel is arranged on another surface side of the substrate and the touch panel is fixed to the substrate using an adhesive agent which absorbs light having a wavelength of not less than 350 nm and not greater than 410 nm.

* * * * *